United States Patent
Yang et al.

(10) Patent No.: US 9,773,831 B1
(45) Date of Patent: Sep. 26, 2017

(54) STACKED TYPE IMAGE SENSORS HAVING A THROUGH SILICON VIA STRUCTURE

(71) Applicant: SK hynix Inc., Gyeonggi-do (KR)

(72) Inventors: Yun-Hui Yang, Gyeonggi-do (KR); Young-Hun Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/258,006

(22) Filed: Sep. 7, 2016

(30) Foreign Application Priority Data

Apr. 29, 2016 (KR) .......................... 10-2016-0052818

(51) Int. Cl.
*H01L 27/146* (2006.01)
(52) U.S. Cl.
CPC .... *H01L 27/14636* (2013.01); *H01L 27/1462* (2013.01); *H01L 27/14618* (2013.01); *H01L 27/14621* (2013.01); *H01L 27/14627* (2013.01); *H01L 27/14643* (2013.01)
(58) Field of Classification Search
CPC ............. H01L 21/146; H01L 21/14618; H01L 21/14621; H01L 21/14636
See application file for complete search history.

(56) References Cited

U.S. PATENT DOCUMENTS

| 9,099,296 | B2 | 8/2015 | Oganesian et al. | |
|---|---|---|---|---|
| 2009/0111258 | A1* | 4/2009 | Kim .................... | H01L 23/3192 438/612 |
| 2014/0264947 | A1* | 9/2014 | Lin ....................... | H01L 21/768 257/777 |
| 2015/0221695 | A1* | 8/2015 | Park ................... | H01L 27/14636 257/774 |
| 2015/0380385 | A1* | 12/2015 | Hsu ..................... | H01L 25/0657 257/774 |
| 2017/0033139 | A1* | 2/2017 | Lu ...................... | H01L 27/14621 |

FOREIGN PATENT DOCUMENTS

| KR | 101225451 | 1/2013 |
|---|---|---|
| KR | 1020150088633 | 8/2015 |
| KR | 1020150091714 | 8/2015 |

* cited by examiner

*Primary Examiner* — Phuc Dang
(74) *Attorney, Agent, or Firm* — IP & T GROUP LLP

(57) ABSTRACT

An image sensor having a lower device, an upper devise, and a TSV structure is provides. The lower device may include a lower substrate, a lower TSV pad, and a lower interlayer insulating layer. The lower TSV pad may be formed over the lower substrate. The lower interlayer insulating layer may cover the lower TSV pad. The upper device may include an upper substrate, an upper TSV pad, and an upper interlayer insulating layer. The upper TSV pad may be formed over the upper substrate. The upper interlayer insulating layer may cover the upper TSV pad. The TSV structure may vertically pass through the upper device and electrically connect the upper TSV pad to the lower TSV pad. The upper TSV pad may include an upper opening. The lower TSV pad may include a unit pad and a lower opening. The unit pad may be exposed through the upper opening and contacts the TSV structure in a top view.

15 Claims, 22 Drawing Sheets

(A)　　　(B)

(C)　　　(D)

(E)　　　(F)

(A)　(B)

(C)

STACKED TYPE IMAGE SENSORS HAVING A THROUGH SILICON VIA STRUCTURE

CROSS-REFERENCE TO RELATED APPLICATION

The present application claims priority to Korean Patent Application No. 10-2016-0052818, filed on Apr. 29, 2016, which is herein incorporated by reference in its entirety.

BACKGROUND

1. Field

Various exemplary embodiments of the inventive concepts relate to a stacked type image sensor having a through-silicon via (TSV) structure and an electronic system having the stacked type image sensor.

2. Description of the Related Art

Due to the demand for high resolution and high speed operation of image sensors, an image sensor having a lower device, an upper device stacked on the lower device, and a TSV structure electrically connecting the electrical circuits of the two devices with each other is a suggested solution. When the TSV structure is formed, the lower device and the upper device have to be aligned accurately. However, since no align key is used; it is difficult to monitor whether a connection fail of the TSV structure occurs when the lower device and the upper device are connected. When the connection fall occurs and is not fixed, resistance of the TSV structure may increase and the image sensor may not function properly.

SUMMARY

Exemplary embodiments of the inventive concepts provide a stacked type image sensor having a TSV structure.

Exemplary embodiments of the inventive concepts provide a stacked type image sensor using a TSV pad as an align key.

Exemplary embodiments of the inventive concepts provide a stacked type image sensor having a TSV pad including an opening.

Exemplary embodiments of the inventive concepts provide a method of fabricating a stacked type image sensor having a TSV structure.

Exemplary embodiments of the inventive concepts provide a method of fabricating a stacked type image sensor which uses a TSV pad as an align key.

Exemplary embodiments of the inventive concepts provide a method of fabricating a stacked type image sensor which has a TSV pad including an opening.

The technical objectives of the inventive concepts are not limited to the above mentioned objectives, and those skilled in the art to which the inventive concepts pertains may evidently understand other objects from the following description.

In accordance with an aspect of the inventive concepts, an image sensor in accordance with the inventive concepts may include a lower device including a lower substrate, a lower TSV pad, and a lower interlayer insulating layer, wherein the lower TSV pad is formed over the lower substrate, wherein the lower interlayer insulating layer covers the lower TSV pad; an upper device including an upper substrate, an upper TSV pad, and an upper interlayer insulating layer, wherein the upper TSV pad is formed over the upper substrate, wherein the upper interlayer insulating layer covers the upper TSV pad; and a TSV structure vertically passing through the upper device and electrically connecting the upper TSV pad to the lower TSV pad. The upper TSV pad includes an upper opening. The lower TSV pad includes a unit pad and a lower opening. The unit pad is exposed through the upper opening and contacts the TSV structure in a top view.

The unit pad may have a bar shape, a crossing bar shape, a closed window shape, a frame shape, or a combination thereof.

The lower opening may have a slit shape, a crossing slit shape, an open window shape, a frame shape, or a combination thereof.

Virtual occupied region of the lower TSV pad may be horizontally wider than the upper opening.

The TSV structure may include an upper TSV structure passing through the upper substrate and contacting an upper surface of the upper TSV pad; and a lower TSV structure extending from the upper TSV structure, passing through the upper TSV pad, and contacting an upper surface of the lower TSV pad.

The lower TSV structure may include an extension portion. The extension portion may pass through the lower TSV pad and extends to a level lower than the lower TSV pad.

The extension portion may contact a side surface of the lower TSV pad.

The lower device may further include a logic gate formed over a first surface of the lower substrate, a multi-layered lower metal interconnection formed over the logic gate, and a lower interlayer insulating layer covering the logic gate and the multi-layered lower metal interconnection. The lower TSV pad may be disposed at the same level as the uppermost one of the lower metal interconnection.

The upper device may further include a photodiode formed in the upper substrate, a transfer gate formed over a first surface of the upper substrate, a multi-layered upper metal interconnection formed over the transfer gate, and an upper interlayer insulating layer covering the multi-layered upper metal interconnection. The upper TSV pad is disposed at the same level as the lowermost one of the upper metal interconnection.

The upper device may further include a TSV isolation structure. The TSV isolation structure is formed in the upper substrate and between the TSV structure and the photodiode to insulate the TSV structure from the photodiode.

In accordance with an aspect of the inventive concepts, an Image sensor may include a lower device including a lower TSV pad; an upper device including an upper TSV pad; and a TSV structure vertically passing through the upper device and electrically connecting the upper TSV pad to the lower TSV pad. The upper TSV pad comprises an upper opening. The upper opening is smaller than the lower TSV pad in size. The lower TSV pad comprises a lower opening. The lower TSV pad is exposed through the upper opening in a top view.

The TSV structure may include an upper TSV structure contacting an upper surface of the upper TSV pad; a lower TSV structure extending from the upper TSV structure through the upper opening to the lower TSV pad; and an extension portion extending from the lower TSV structure through the lower opening into the lower device.

The lower opening may have at least one of a slit shape, a crossing shape, an open widow shape, or a frame shape.

In accordance with an aspect of the inventive concepts, an image sensor may include a lower device comprising a lower substrate, a logic gate, a lower TSV pad, and a lower interlayer insulating layer, wherein the lower substrate, the logic gate, and the lower TSV pad are formed over the lower substrate, wherein the lower interlayer insulating layer surrounds the logic gate and the lower TSV pad; an upper device comprising an upper substrate, a photodiode, a transfer gate, an upper TSV pad, an upper interlayer insulating layer, a capping layer, a passivation layer, a color filter, and a micro-lens, wherein the photodiode is formed in the upper substrate, wherein the transfer gate and the upper TSV pad are formed over a first surface of the upper substrate, wherein the upper interlayer insulating layer surrounds the transfer gate and the upper TSV pad, wherein the capping layer and the passivation layer are formed over a second surface of the upper substrate, wherein the color filter and the micro-lens are formed over the passivation layer; and a TSV structure vertically passing through the upper substrate and the upper interlayer insulating layer and extending into the lower interlayer insulating layer. The TSV structure passes through the upper TSV pad and extends to the lower TSV pad.

The upper TSV pad may include an upper opening. The lower TSV pad may include a lower opening. The TSV structure may include an upper TSV structure passing through the upper substrate; a lower TSV structure extending from the upper TSV structure and passing through the upper opening; and an extension portion extending from the lower TSV structure through the lower opening into the lower interlayer insulating layer.

The lower opening may have a slit shape, a crossing slit shape, an open windows, or a frame shape.

The lower interlayer insulating layer may surround an upper surface and a side surface of the logic gate, and further surround an upper surface, a side surface, and a bottom surface of the lower TSV pad. The TSV structure may pass through the lower TSV pad and extend to the lower interlayer insulating layer and below the lower TSV pad.

The details of other embodiments are included in the detailed description and the drawings.

BRIEF DESCRIPTION OF THE DRAWINGS

The foregoing and other features and advantages of the inventive concepts will be apparent from the detailed description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
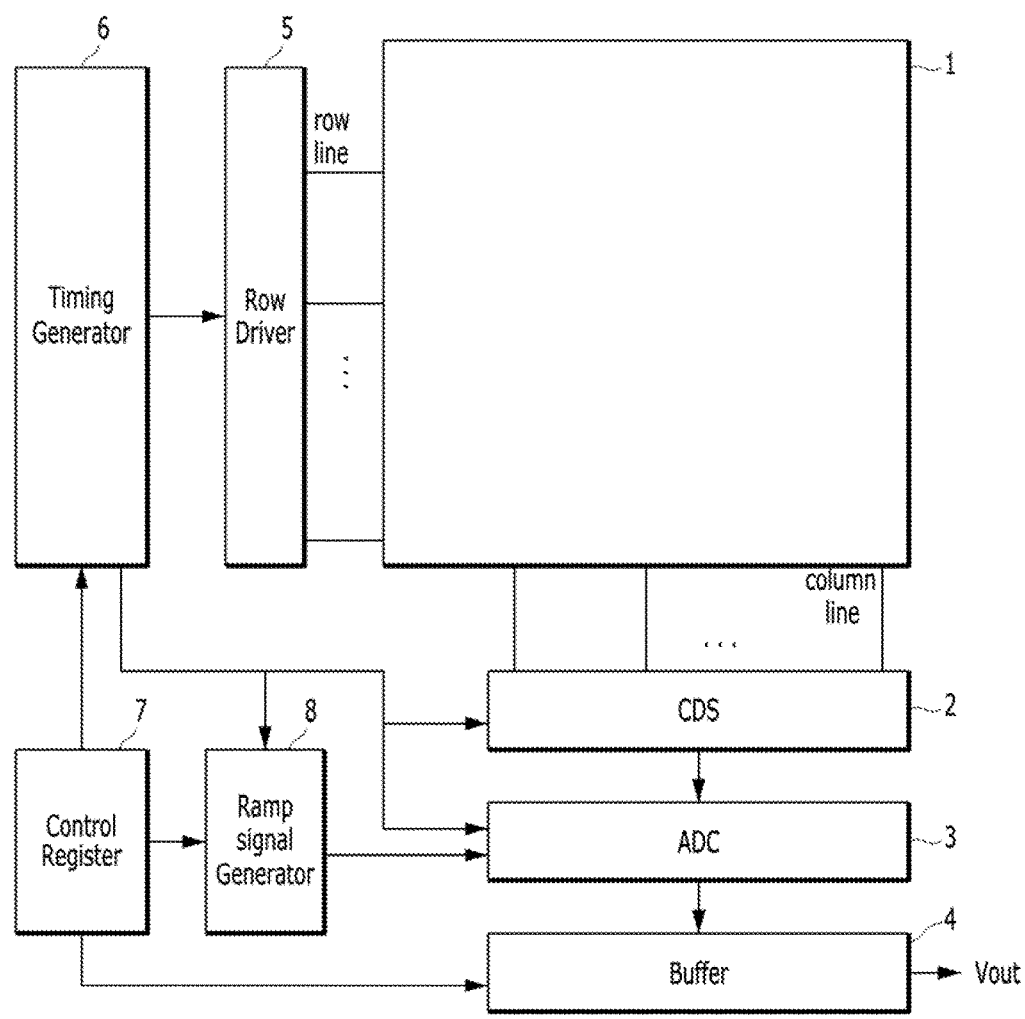
FIG. 1 is a block diagram schematically illustrating an image sensor in accordance with an embodiment of the inventive concepts.

Various embodiments will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. Throughout the disclosure, like reference numerals refer to like parts throughout the various figures and embodiments of the inventive concepts.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

The merits and characteristics of the inventive concepts and methods for achieving the merits and characteristics will become evident from embodiments described in detail later in conjunction with the accompanying drawings. However, the inventive concepts are not limited to the disclosed embodiments, but may be implemented in various different ways. The embodiments are provided to only complete the disclosure of the inventive concepts and to allow a person having ordinary skill in the art to which the inventive concepts pertains to completely understand the category of the inventive concepts. The inventive concepts are only defined by the category of the claims.

Terms used in the specification are provided to describe the embodiments and are not intended to limit the inventive concepts. In the specification, the singular form, unless specially described otherwise, may include the plural form. Furthermore, terms, such as "comprises" and/or "comprising" used in the specification, do not exclude the existence or addition of one or more elements, steps, operations and/or devices in the described elements, steps, operations and/or devices.

When it is described that one element is "connected to" or "coupled to" the other element, it means that the one element may be directly connected or coupled to the other element or a third element may be interposed between the two elements. In contrast, when it is described that one element is "directly connected to" or "directly coupled to" the other element, it means that a third element is not interposed between the two elements. The term "and/or" includes a combination of respective described items and all of combinations of one or more of the items.

Spatially relative terms, such as "below", "beneath", "lower", "above", and "upper", may be used to easily describe the correlations between one element or elements and the other element or other elements as illustrated in the drawings. The spatially relative term should be understood as encompassing different directions of an element in use or operation in addition to the direction depicted in the drawing. For example, if the element in the drawing is turned over, one element described as being "below" or "beneath" the other element would then be placed "above" the other element.

Furthermore, the embodiments described in this specification may be described with reference to cross-sectional views and/or plane views, that is, ideal exemplary diagrams of the inventive concepts. In the drawings, the thickness of films and areas has been enlarged to effectively describe technical contents. Accordingly, forms of the exemplary diagrams may be changed by a manufacturing technology and/or tolerance. Accordingly, the embodiments of the inventive concepts are limited to the illustrated specific forms, but may include a change in a form generated according to a manufacturing process. For example, an area illustrated as being a right angle may be a rounded form or a form having a specific curvature. Accordingly, areas illustrated in the drawings have approximate attributes, and the forms of the illustrated areas are provided to illustrate specific forms of the areas of a device and are not intended to limit the scope of the inventive concepts.

Throughout the specification, the same reference numerals denote the same elements. Accordingly, the same reference numerals or similar reference numerals may be described with reference to other drawings although they are mentioned or described in corresponding drawings. Furthermore, although reference numerals are not shown, they may be described with reference to other drawings.

FIG. 1 is a block diagram schematically illustrating an image sensor in accordance with an embodiment of the inventive concepts. Referring to FIG. 1, the image sensor in accordance with an embodiment of the inventive concepts may include a pixel array 1, a correlated double sampler (CDS) 2, an analog-to-digital converter (ADC) 3, a buffer 4, a row driver 5, a timing generator 6, a control register 7, and a ramp signal generator 8.

The pixel array 1 may include pixels disposed in a matrix structure. The pixels may convert optical image information into an electrical image signal and transmit the electrical image signal to the CDS 2 through column lines. Each of the pixels may be coupled to one of row lines and one of column lines, respectively.

The CDS 2 may hold and sample the electrical image signals received from the pixels of the pixel array 1. For example, the CDS 2 may sample a reference voltage level and voltage levels of the received electrical image signals according to a clock signal provided from the timing generator 6, and transmit an analog signal corresponding to the difference thereof to the ADC 3.

The ADC 3 may convert the received analog signal into a digital signal and transmit the digital signal to the buffer 4.

The buffer 4 may latch the received digital signal and sequentially output the latched signal to an external video signal processor. The buffer 4 may include a memory to latch the digital signal and a sense amplifier to amplify the digital signal.

The row driver 5 may drive the plurality of pixels of the pixel array 1 according to a signal of the timing generator 6. For example, the row driver 5 may generate driving signals to selectively drive one of the row lines.

The timing generator 6 may generate a timing signal to control the CDS 2, the ADC 3, the row driver 5, and the ramp signal generator 8. The control register 7 may generate control signals to control the buffer 4, the timing generator 6, and the ramp signal generator 8. The ramp signal generator 8 may generate a ramp signal to control an image signal, which is outputted from the buffer 4, under the control of the timing generator 6.

Figure 2:
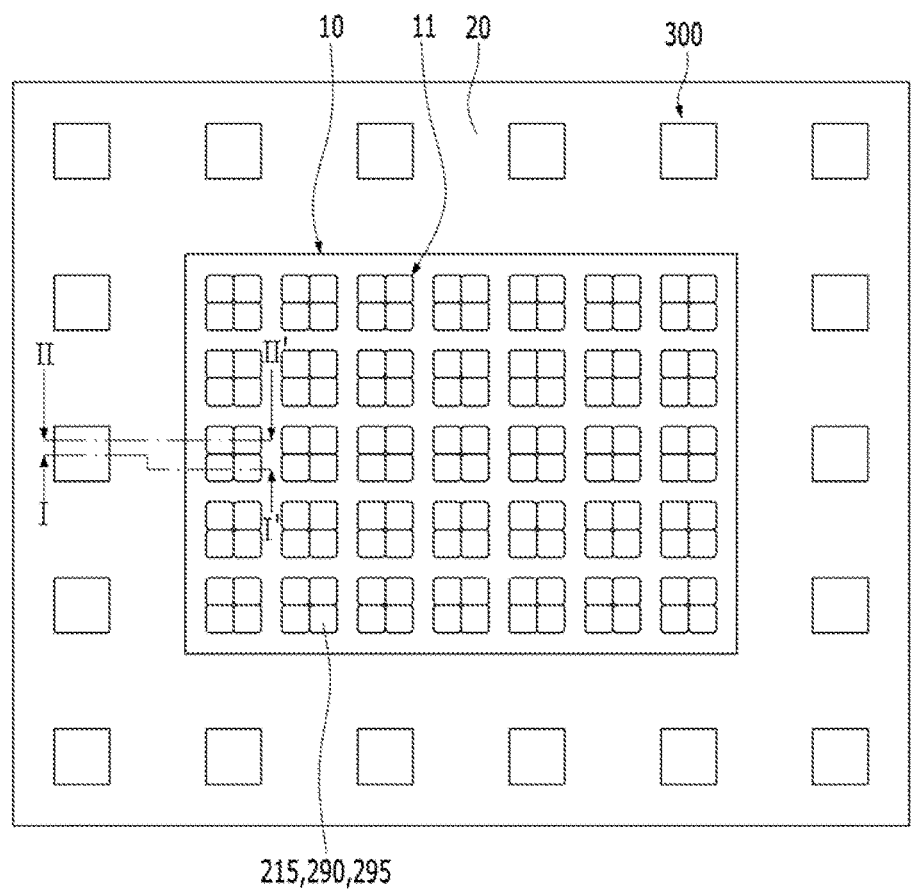
FIG. 2 is a schematic layout illustrating an image sensor in accordance with an exemplary embodiment of the inventive concepts.
Figure 3A:
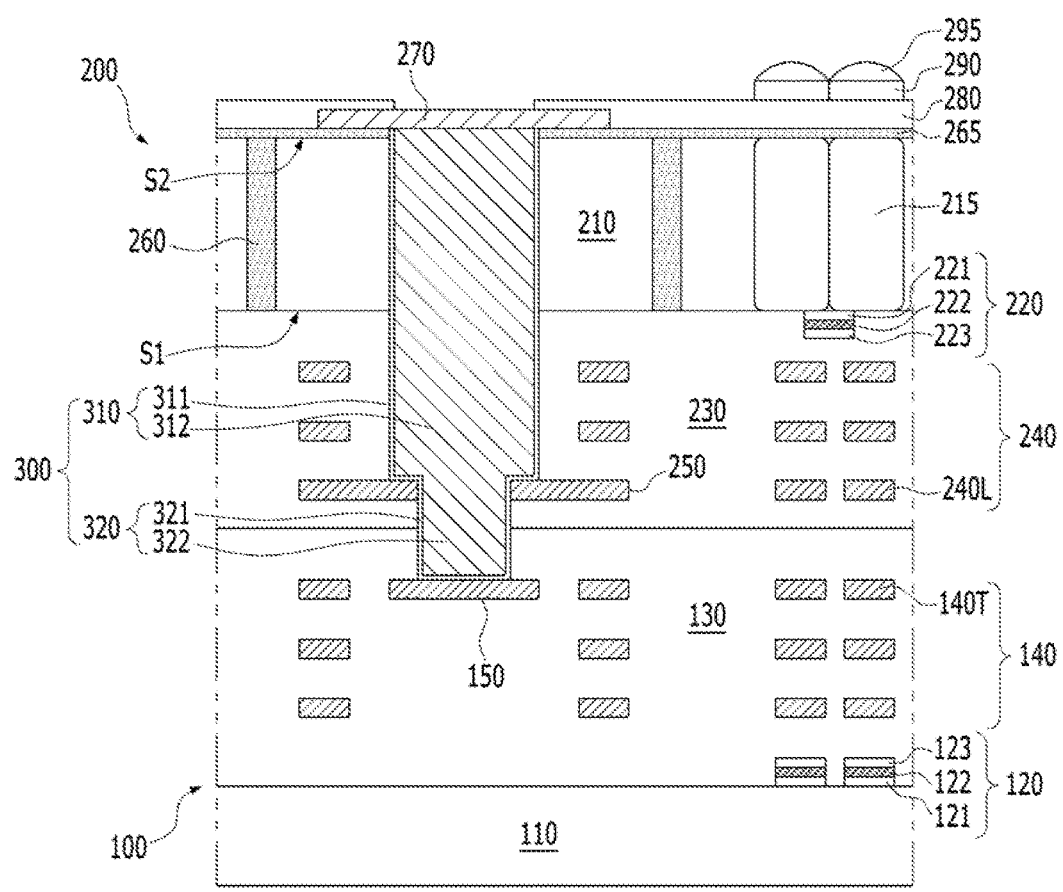
FIGS. 3A and 3B are schematic sectional views taken along I-I' and II-II' of the image sensor shown in FIG. 2.
Figure 3B:
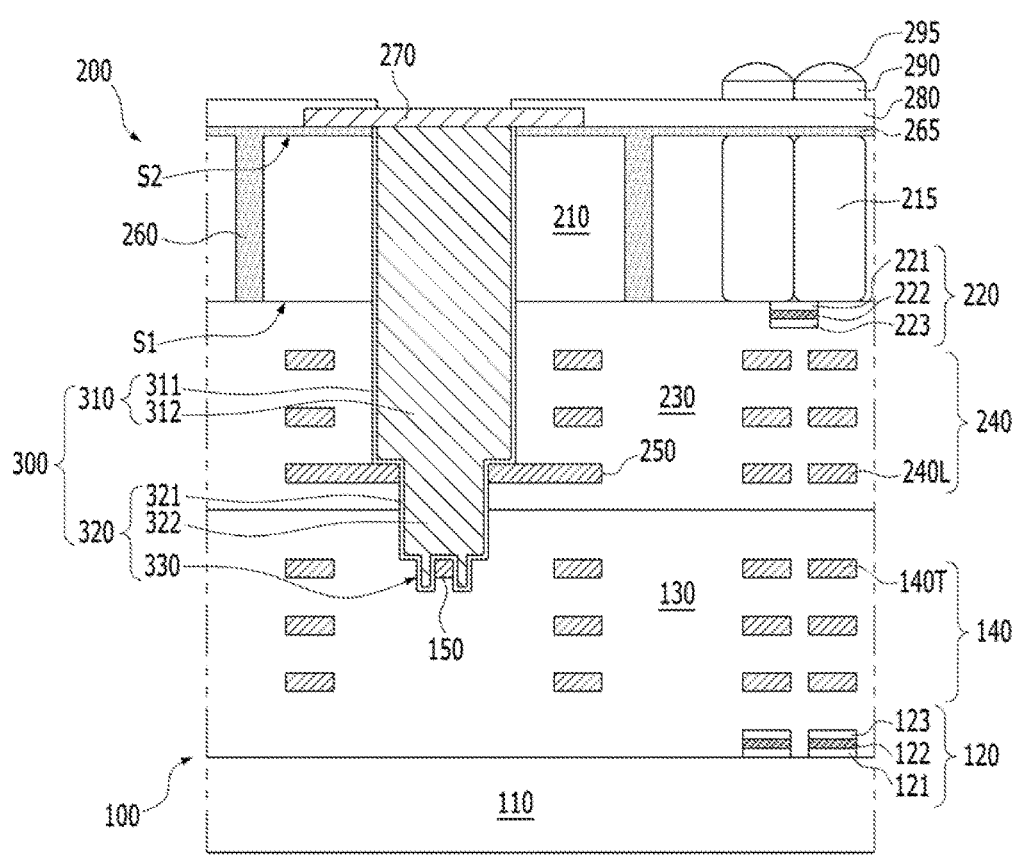

FIG. 2 is a schematic layout illustrating an image sensor in accordance with an exemplary embodiment of the Inventive concepts. FIGS. 3A and 3B are sectional views taken along the line I-I' and the line II-II' shown in FIG. 2, respectively.

Referring to FIG. 2, an image sensor in accordance with an exemplary embodiment of the inventive concepts may include a pixel area 10 in a central region and a TSV area 20 in a peripheral region. A plurality of pixels 11 may be disposed in the pixel area 10. Further referring to FIGS. 3A and 3B, photodiodes 215, color filters 290, and micro-lenses 295 may be disposed in the pixels 11. TSV structures 300 may be disposed in the TSV area 20 and surround the pixel area 10.

Referring to FIGS. 3A and 3B, the image sensor in accordance with the inventive concepts may include a lower device 100, an upper device 200, and a TSV structure 300. The lower device 100 may include a lower substrate 110, logic gates 120, multi-layered lower metal interconnections 140, a lower TSV pad 150, and a lower interlayer insulating layer 130 on the lower substrate 110.

The lower substrate 110 may include a silicon wafer. The logic gates may process various signals. Each of the logic gates 120 may include a logic gate insulating layer 121, a logic gate electrode 122, and a logic gate capping layer 123. The logic gate insulating layer 121 may include oxidized silicon, the logic gate electrode 122 may include a conductive layer such as a metal, and the logic gate capping layer 123 may include a material such as silicon nitride denser than silicon oxide.

The multi-layered lower metal interconnections 140 may transfer various electrical signals, and include a metal such as tungsten (W) or a conductive material.

The lower TSV pad 150 may be disposed at the same level as an uppermost lower metal interconnection 140T. That is, the lower TSV pad 150 may be disposed at the same level as the lower metal interconnection 140T which is the farthest distance from a surface of the lower substrate 110. The lower TSV pad 150 may include a metal such as tungsten (W) or copper (Cu). The lower TSV pad 150 will be described more detail.

The lower interlayer insulating layer 130 may cover or surround upper surfaces, side surfaces, and/or bottom surfaces of the logic gates 120, the multi-layered lower metal interconnections 140, and the lower TSV pad 150. The lower interlayer insulating layer 130 may include silicon oxide, silicon nitride, silicon oxy-nitride, or a combination thereof.

The upper device 200 may include an upper substrate 210, photodiodes 215 and a TSV isolation structure 260 in the upper substrate 210, a transfer gate 220, multi-layered upper metal interconnections 240, an upper TSV pad 250, and an upper interlayer insulating layer 230 on a first side S1 of the upper substrate 210, and a capping layer 265, a top pad 270, a passivation layer 280, color filters 290, and micro-lenses 295 on a second side S2 of the upper substrate 210. The upper substrate 210 may include a silicon wafer, an epitaxially grown single crystalline silicon layer, or other semiconductor substrate. The upper substrate 210 may be a device substrate. In some embodiments of the inventive concepts, the upper substrate 210 may be a handling substrate.

The photodiodes 215 may include an n-type region having n-type impurity ions such as phosphorous (P) or arsenic (As), and a p-type region having p-type impurity ions such as boron (B).

The TSV isolation structure 260 may include insulating partitions. The TSV isolation structure 260 may divide the upper substrate 210 to electrically insulate the TSV structure 300 from the photodiodes 215. The TSV isolation structure 260 may have a rectangle shape when viewed from the top.

The transfer gate 220 may be disposed on the first side S1 of the upper substrate 210 to be partially overlapped with the photodiodes 215. The transfer gate 220 may transfer electrons generated in the photodiodes 215 to a floating diffusion region (not shown). The transfer gate 220 may include a transfer gate insulating layer 221, a transfer gate electrode 222, and a transfer gate capping layer 223. The transfer gate insulating layer 221 may include oxidized silicon, the transfer gate electrode 222 may include a conductor such as a metal, and the transfer gate capping layer 223 may include an Insulating material such as silicon nitride which is denser than silicon oxide.

The multi-layered upper metal interconnections 240 may transfer various electric signals and include a conductor or a metal such as tungsten (W).

The upper TSV pad 250 may be disposed at the same level as the upper metal interconnections 240L which is located at the lowermost level among the upper metal interconnections 240. That is, the upper TSV pad 250 may be disposed at the same level as the upper metal interconnection 240L which is the farthest distance from a surface of the upper substrate 210. The upper TSV pad 250 may include a metal such as tungsten (W) or copper (Cu). The upper TSV pad 250 may be greater than the lower TSV pad 150 in horizontal width.

The upper interlayer insulating layer 230 may cover or surround upper surfaces, side surfaces, and/or bottom surfaces of the transfer gate 220, the multi-layered upper metal interconnections 240, and the upper TSV pad 250. The upper interlayer insulating layer 230 may include silicon oxide, silicon nitride, silicon oxy-nitride, or a combination thereof.

The capping layer 265 and the passivation layer 280 may be disposed on the second surface S2 of the upper substrate 210. The capping layer 265 may include silicon oxide, silicon nitride, silicon oxy-nitride, or a combination thereof. For example, the capping layer 265 and the passivation layer 280 may include the same material as the TSV isolation structure 260.

The top pad 270 may be disposed on the TSV structure 300 and the capping layer 265. The top pad 270 may include a conductor such as copper (Cu), nickel (Ni), silver (Ag), aluminum (Al), or other metals. A solder ball, a solder bump, a bonding pad, or a bonding wire may be disposed on the top pad 270. An upper surface of the top pad 270 may be partially exposed by the passivation layer 280.

The color filters 290 and the micro-lenses 295 may be disposed on the second side S2 of the upper substrate 210 to form the pixel array 1 shown in FIG. 1. The color filters 290 and the micro-lenses 295 may include organic material.

The upper device 200 may be stacked on the lower device 100 so that an active side of the upper device 200 and an active side of the lower device 100 face each other. The active sides may indicate which sides the logic gate 120 and the transfer gate 220 are formed on.

The TSV structure 300 may completely pass through the upper substrate 210 and the upper interlayer insulating layer 230, and partially pass through the lower interlayer insulating layer 130. The TSV structure 300 may include an upper TSV structure 310 and a lower TSV structure 320.

The upper TSV structure 310 may vertically pass through the upper substrate 210 and the upper interlayer insulating layer 230 and contact the upper TSV pad 250. The lower TSV structure 320 may vertically pass though the upper TSV pad 250, a portion of the upper interlayer insulating layer 230, and a portion of the lower interlayer insulating layer 130 and contact the lower TSV pad 150. The lower TSV pad 150 may be greater than the lower TSV structure 320 in horizontal width.

The upper TSV structure 310 may include an upper TSV barrier layer 311 and an upper TSV plug 312, and the lower TSV structure 320 may include a lower TSV barrier layer 321 and a lower TSV plug 322. The upper barrier layer 311 and the lower TSV barrier layer 321 may include titanium (Ti), titanium nitride (TiN), tantalum (Ta), tantalum nitride (TaN), or other barrier metals. The upper TSV barrier layer 311 and the lower TSV barrier layer 321 may be formed in a single body, formed of the same material, and have a continuous structure. The upper TSV plug 312 and the lower TSV plug 322 may also be formed in a single body, formed of the same material, and have a continuous structure.

The lower TSV structure 320 may include extension portions 330. The extension portions 330 may vertically pass through the lower TSV pad 150 and extend downwardly. The extension portions 330 may contact a portion of side surfaces of the lower TSV pad 150.

Figure 4A:
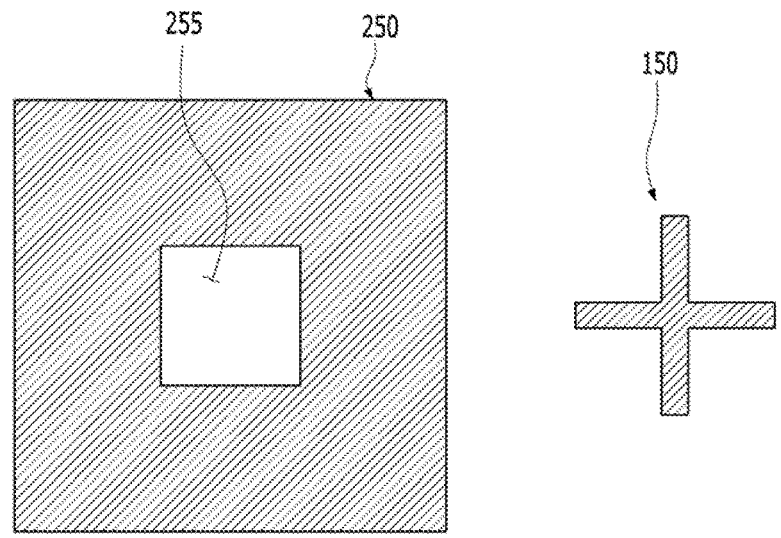
FIG. 4A illustrates top views of the upper TSV pad 250 and the lower TSV pad 150.
Figure 4B:
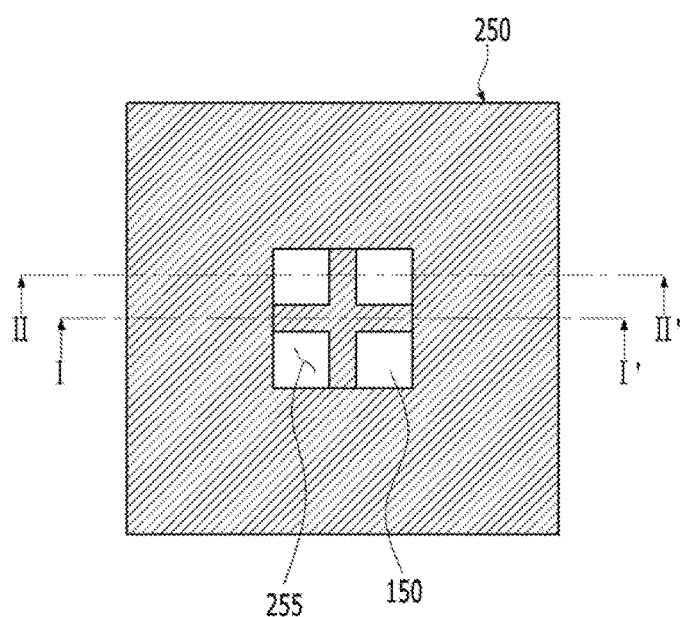
FIG. 4B is a top view of FIG. 3A or 3B and Illustrates an overlaid structure of the upper TSV pad 250 and the lower TSV pad 150.

FIG. 4A illustrates top views of the upper TSV pad 250 and the lower TSV pad 150. FIG. 4B is a top view of FIG. 3A or 3B and illustrates an overlaid structure of the upper TSV pad 250 and the lower TSV pad 150. To easily describe the inventive concepts, line I-I' and II-II' of FIG. 2 are included in FIG. 4B.

Referring to FIGS. 4A and 4B, the upper TSV pad 250 in accordance with the inventive concepts may have an upper opening 255 in a central region. The lower TSV pad 150 may have a shape that is identified through the upper opening 255. In a top view, the upper opening 255 may partially or entirely expose the lower TSV pad 150. In an embodiment, the upper TSV pad 250, the upper opening 255, and the lower TSV pad 150 may have a rectangle shape, a circular shape, or other polygon shape, respectively.

A horizontal width of the upper opening 255 may be smaller than a width of the lower TSV pad 150. That is, in a top view, a portion of the lower TSV pad 150 may be not visually exposed and may be blinded by the upper opening 255. The lower TSV pad 150 will be described more detail.

Figure 5A:
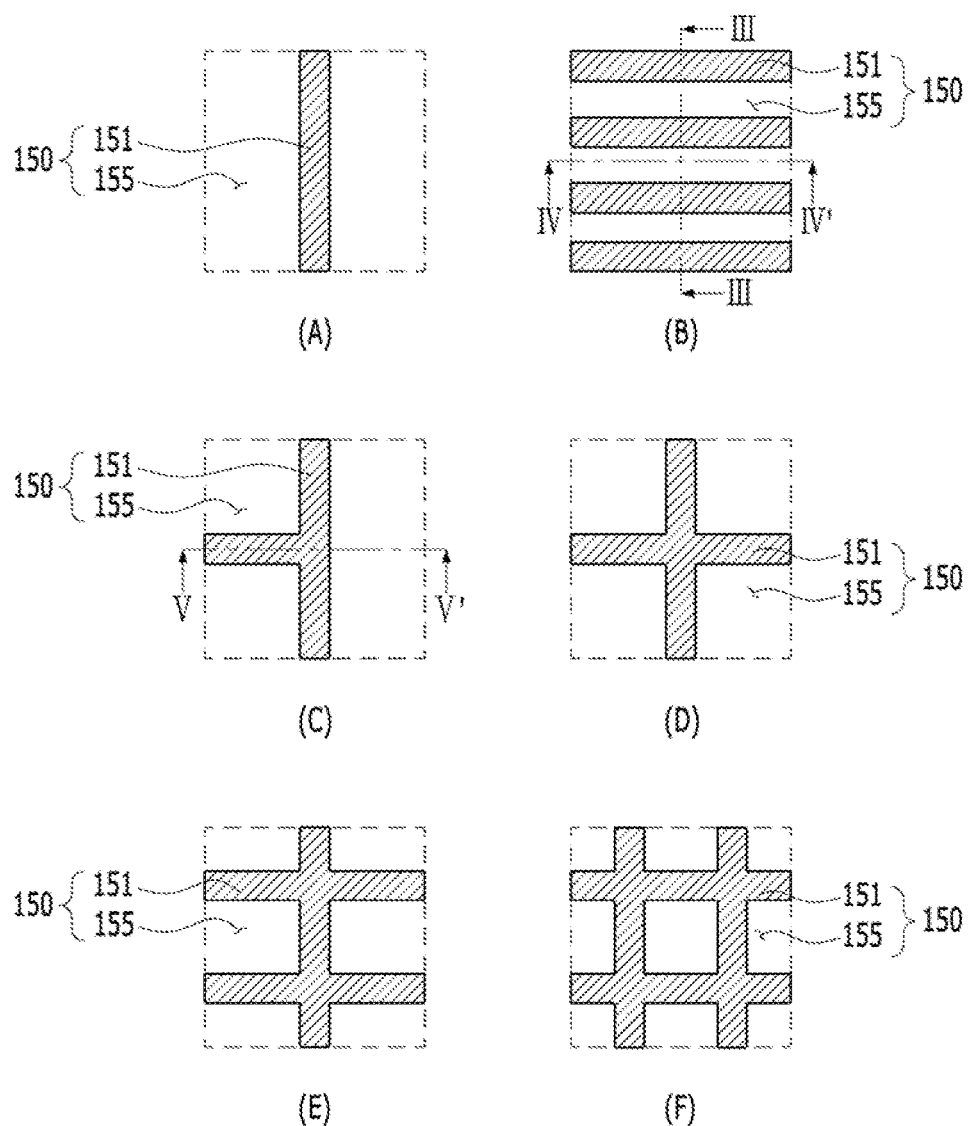
FIGS. 5A to 5D are top views illustrating the lower TSV pads in accordance with various embodiments of the inventive concepts.

FIGS. 5A to 5D are top views illustrating the lower TSV pads 150 in accordance with various embodiments of the inventive concepts. Referring to FIG. 5A, the lower TSV pads 150 in accordance with various embodiments of the inventive concepts may include unit pads 151 having various bars shapes. Referring to (A), the lower TSV pad 150 may include a unit pad 151 which has a vertical or horizontal bar shape, for example, "|" or "—" shapes, and lower openings 155 which have open windows shapes. Referring to (B), the lower TSV pad 150 may include a unit pad 151 which has a plurality of horizontal or vertical parallel bars, and lower openings 155 which have a plurality of parallel slits.

Referring to (C), the lower TSV pad 150 may include a unit pad 151 which has a horizontal or vertical bar and a half bar which are perpendicular with each other, for example, a "T" shape, and lower openings 155 which have open windows shapes. Referring to (D), the lower TSV pad 150 may include a unit pad 151 which has a crossing bar shape, for example, a "+" shape, and lower openings 155 which have open windows shapes.

Referring to (E) and (F), the lower TSV pads 150 may include unit pads 151 which have vertical and horizontal bars perpendicular to each other and have lattice shaped lower openings. The unit pads 151 of the lower TSV pads 150 may have the slits shapes or the open windows shapes. The unit pads 151 may define the lower openings 155. Or the unit pads 151 may be defined by the lower openings 155. The slits shapes may be interpreted as reversed bars shapes.

Referring back to (B), a given unit pad 151 may be connected with a neighboring unit pad 151 so that the unit pad 151 is formed of a single body. For example, the unit pads 151 shown as separated may be shapes viewed through the upper opening 255, and may substantially have a frame shape or a lattice shape being connected with each other.

Further referring to FIGS. 4A and 4B, dotted lines at the perimeter of the lower TSV pads 150 may indicate virtual occupied regions of the lower TSV pads 150. For example, each of the virtual occupied regions of the lower TSV pads 150 may have a square region one side of which is defined by the maximum width of each of the unit pads 151 and the lower openings 155. According to the inventive concepts, the virtual occupied regions of the lower TSV pads 150 may be greater in size than actual occupied regions of the upper openings 255.

A width of an individual bar of the unit pad 151 may be smaller than a width of the upper opening 255 of the upper TSV pad 250. Accordingly, the unit pad 151 of the lower TSV pad 150 can be visually identified through the upper opening 255 of the upper TSV pad 250, and can be used as a key pattern to align the TSV structure 300, the upper TSV pad 250, and the lower TSV pad 150. The inventive concepts applied to the lower TSV pads 150 shown in (A) to (D) may be variously combined and applied.

Figure 5B:
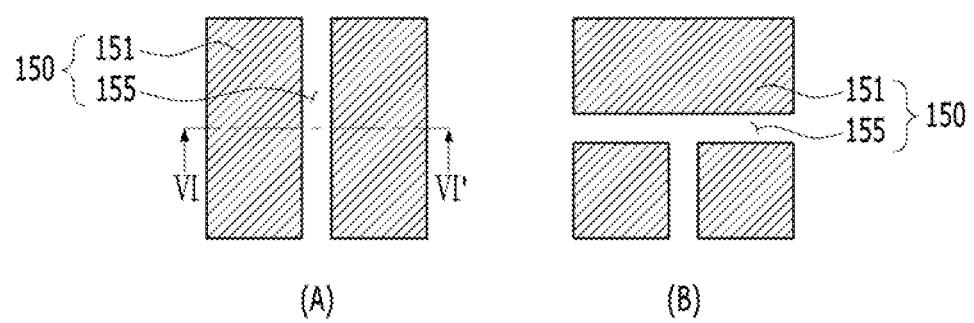
Figure 5B:
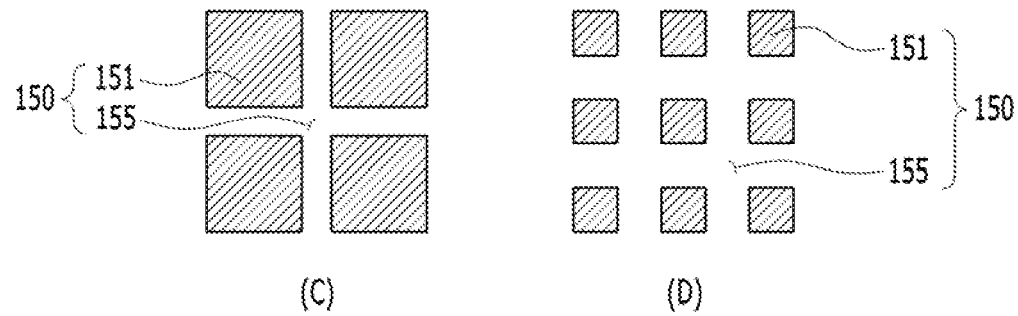
Figure 5B:
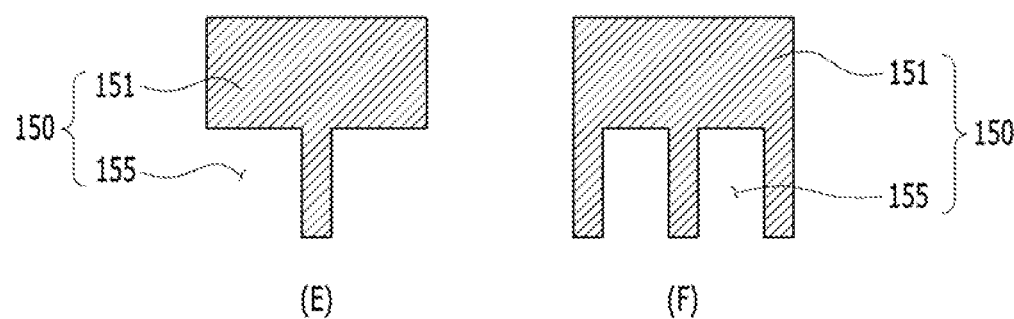
Figure 5C:
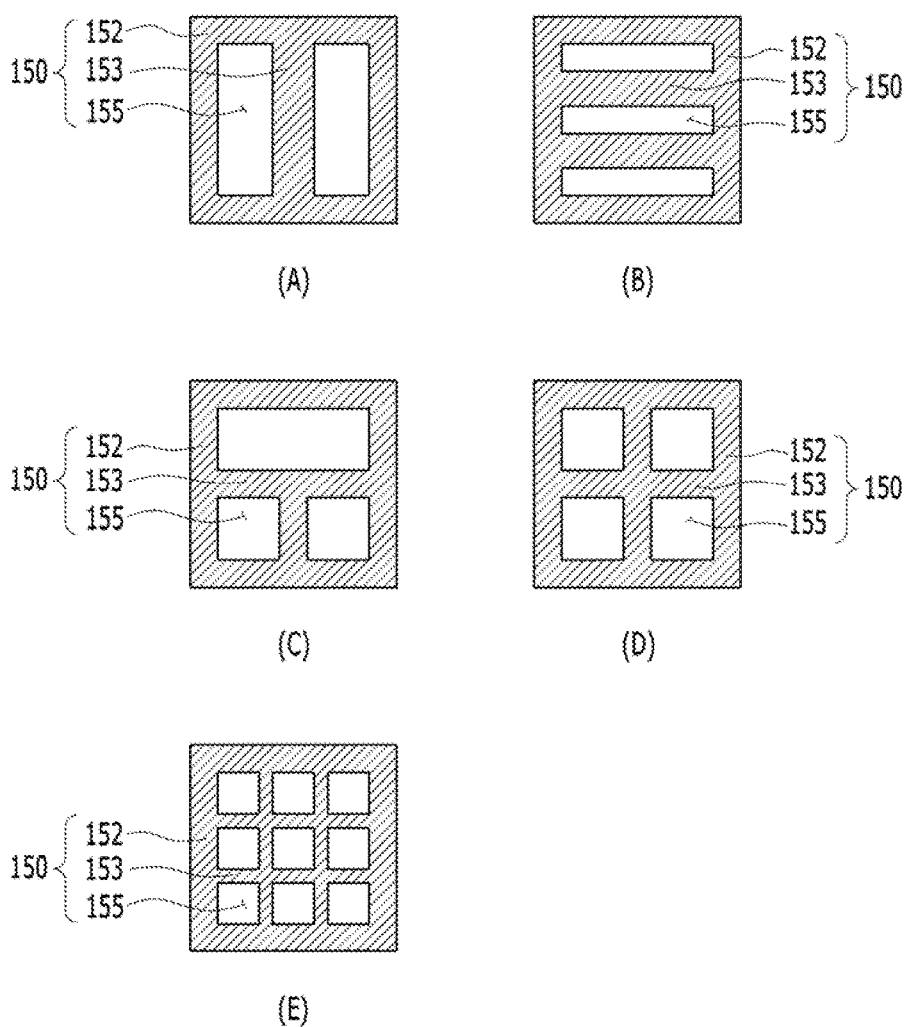

Referring to (A) to (D) in FIG. 5B, the lower TSV pads 150 in accordance with the inventive concepts may have unit pads 151. Each of the unit pads 151 has an island shape. The unit pads 151 are separated from each other by the lower opening 155 which is in a slit shape or in a crossing slit shape.

For example, the unit pads 151 may have a closed window shape. Specific shapes of the slit shaped lower openings 155 may be understood in reference with the bars shown in FIG. 5A. The slit-shaped lower opening 155 may be a smaller width than a width of the upper opening 255 of the upper TSV pads 250. Accordingly, the slit-shaped lower openings 155 of the lower TSV pads 150 may be visually identified through the upper opening 255 of the upper TSV pad 250, and can be used as a key pattern to align the TSV structure 300, the upper TSV pad 250, and the lower TSV pad 150.

Referring to (A) to (D) of FIG. 5B, the shapes of the unit pads 151 may be defined as shown through the upper opening 255. For example, the unit pads 151 may have island shapes divided by the lower openings 155. However, the actual shapes of the unit pads 151 may be different from the shapes shown through the upper opening 255. For example, the unit pads 151 may be connected to each other and, in combination, form a single frame shape or a single lattice shape.

An interface between the outer unit pad 152 and the inner unit pad 153 may virtually exist. The lower openings 155 may define the unit pads 151 having the bar shape or the frame shape.

Figure 5D:
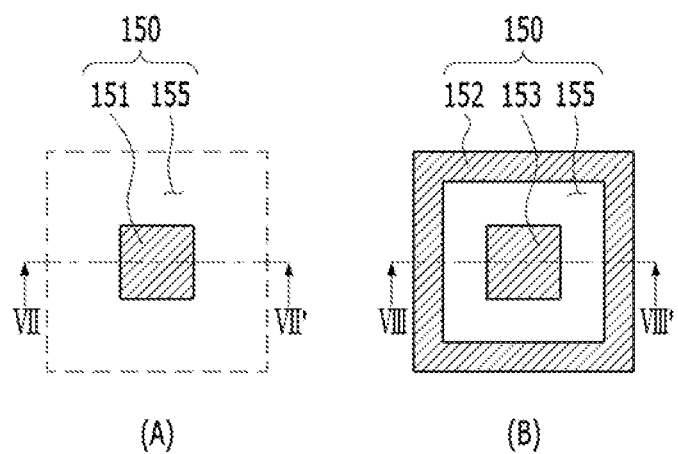
Figure 5D:
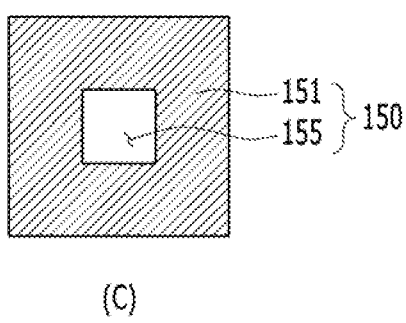

Referring to FIG. 5D, lower TSV pads in accordance with various embodiments of the inventive concepts may include island-shaped unit pads 151. For example, the unit pads 151 may include closed windows shapes or frame shapes. Referring to (A), the lower TSV pad 150 may include a unit pad 151 having a smaller width than a width of the upper opening 255 of the upper TSV pad 250. Referring to (B), the lower TSV pad 150 may include island-shaped inner unit pads 153 disposed in the frame shaped outer unit pad 152. The inner unit pad 153 may have a smaller width than a width of the upper opening 255 of the upper TSV pad 250. The unit pads 152 and 253 may be one body and be connected with other. Referring to (C), the lower TSV pad 150 may include an island shaped lower opening 155. The lower opening 155 may have a smaller width than a width of the upper opening 255 of the upper TSV pad 250.

Figure 6A:
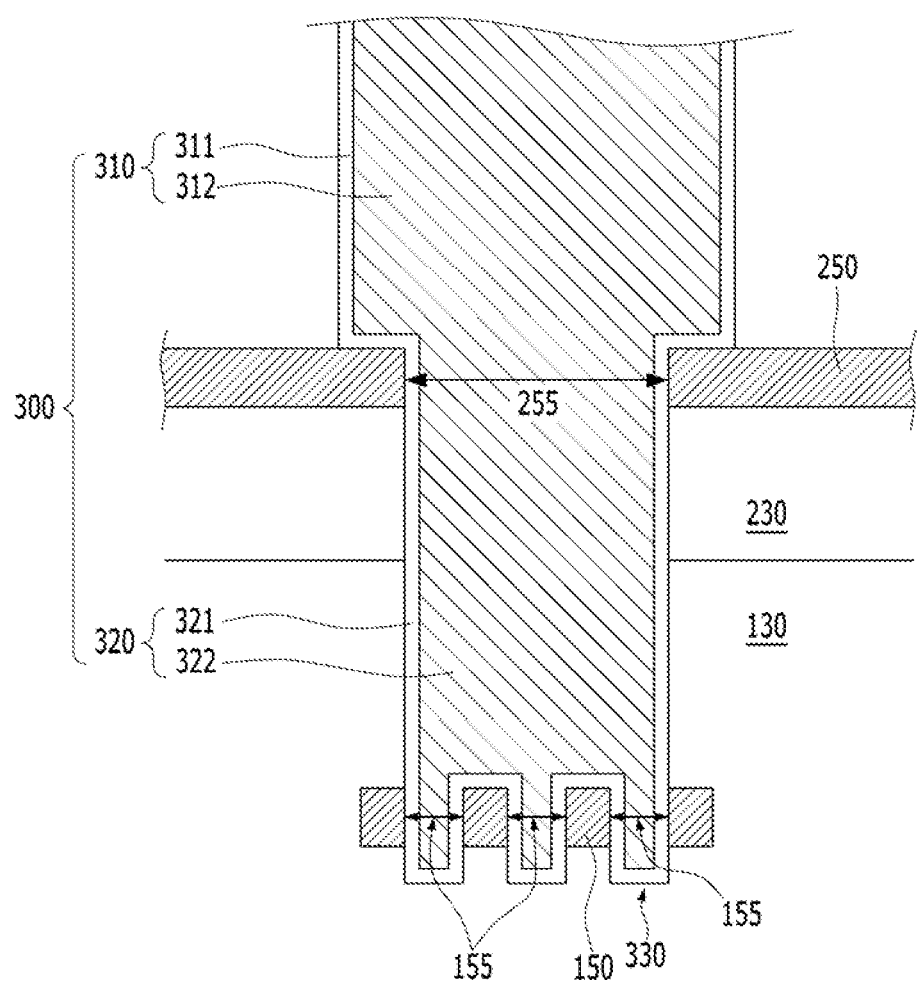
FIG. 6A is a sectional view taken along the line III-III' shown in FIG. 5A.
Figure 6B:
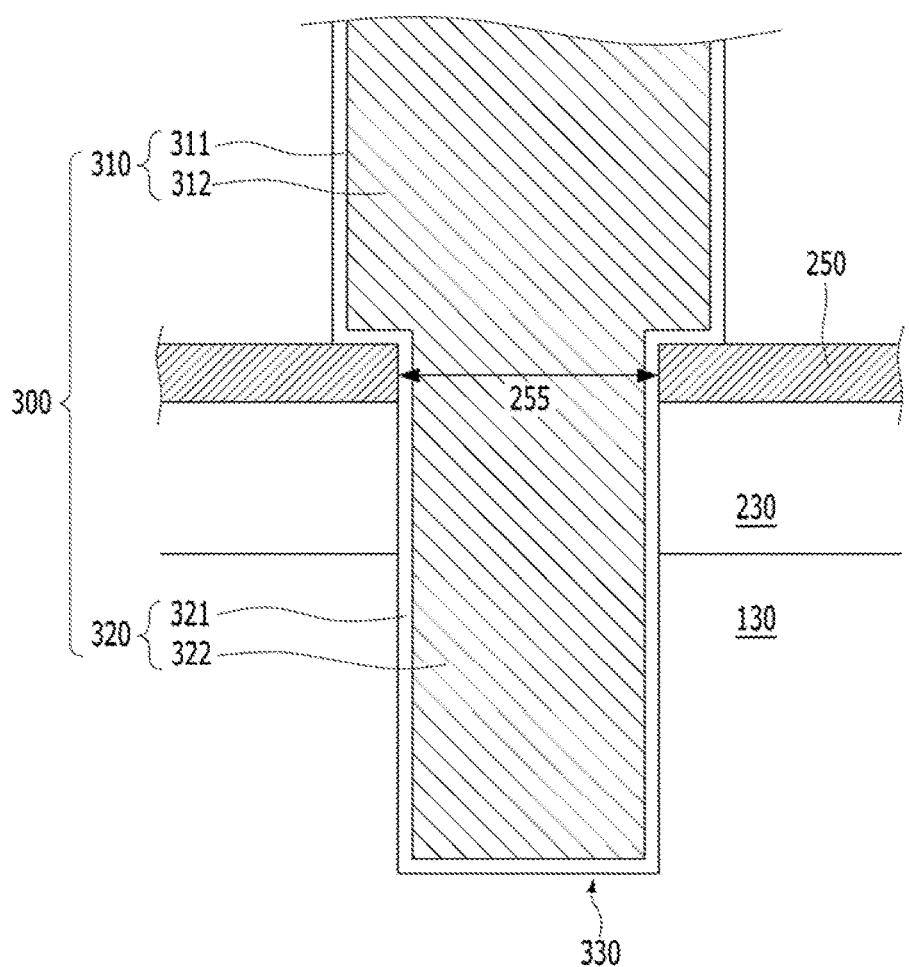
FIG. 6B is a sectional view taken along the line IV-IV' shown in FIG. 5A.

FIGS. 6A and 6B are schematic longitudinal sectional views illustrating TSV structures 300 contacting the lower TSV pads 150 in accordance with embodiments of the inventive concepts shown in (B) of FIG. 5A. FIG. 6A is a longitudinal sectional view taken along III-III', and FIG. 6B is a longitudinal sectional view taken along IV-IV'. Referring to FIGS. 6A and 6B, the TSV structure 300 in accordance with an embodiment of the inventive concepts may include the upper TSV structure 310 contacting the upper TSV pad 250 and the lower TSV structure contacting the lower TSV pad 150. The lower TSV structure 320 may include the extension portions 330 contacting both side surfaces of the unit pads 151 of the lower TSV pads 150. Specifically, the extension portions 330 may pass through the lower openings 155 of the lower TSV pad 150 and downwardly extend.

Figure 6C:
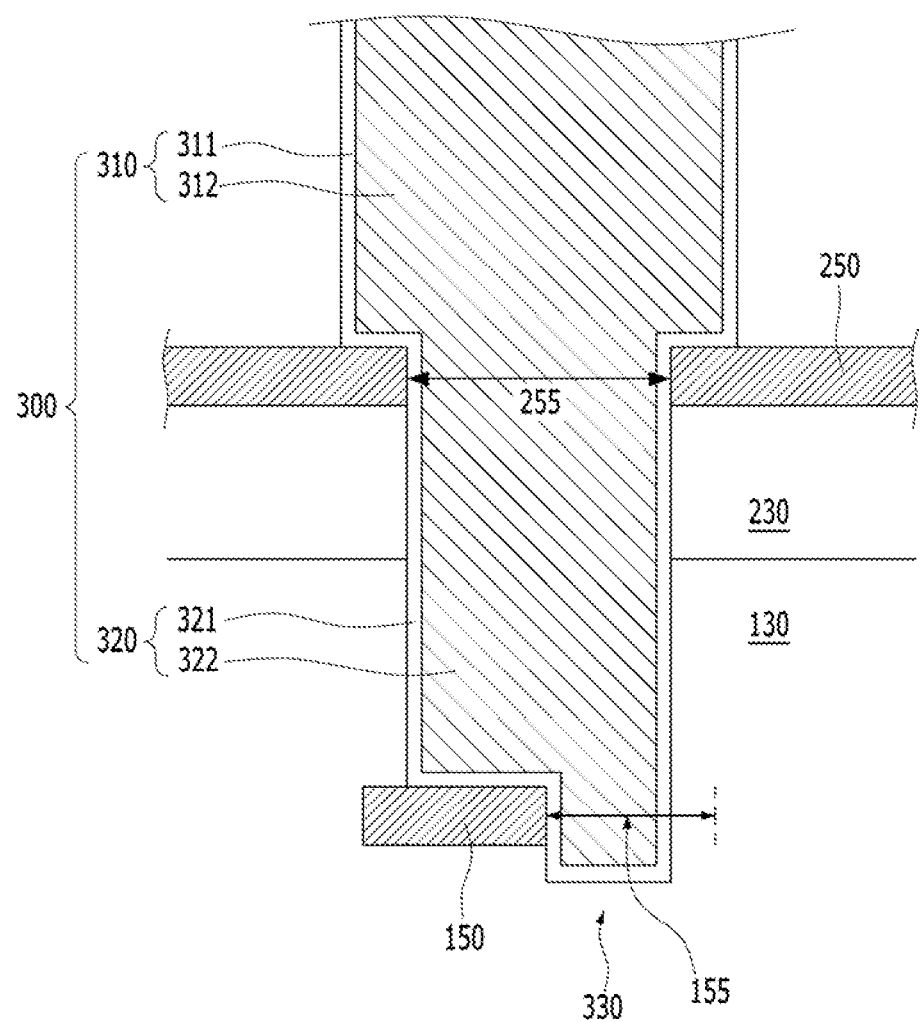
FIG. 6C is a sectional view taken along the line V-V' in FIG. 5A and Illustrates a TSV structure which contacts a lower TSV pad in accordance with an embodiment of the inventive concepts shown in (C) of FIG. 5A.

FIG. 6C is a schematic longitudinal sectional view taken along V-V' of TSV structure 300 contacting the lower TSV pad 150 in accordance with an embodiment of the inventive concepts shown in (C) of FIG. 5A. Referring to FIG. 6C, the TSV structure 300 in accordance with an embodiment of the inventive concepts may include the upper TSV structure 310 contacting the upper TSV pad 250 and the lower TSV structure 320 contacting the lower TSV pad. The lower TSV structure may include the extension portions 330 extending downwardly to contact a side surface of the unit pad 151 of the lower TSV pad 150.

Figure 6D:
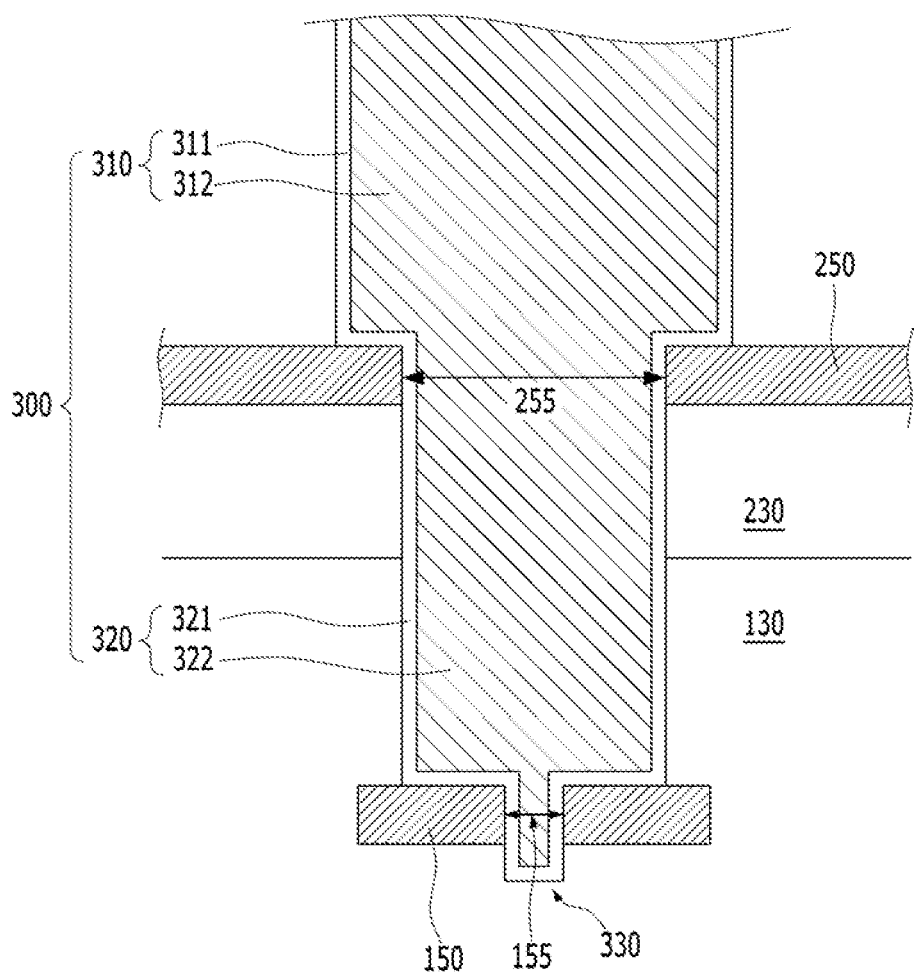
FIG. 6D is a sectional view taken along the line VI-VI' in FIG. 5B and Illustrates a TSV structure which contacts a lower TSV pad in accordance with an embodiment of the inventive concept.

FIG. 6D is a schematic longitudinal sectional view illustrating the TSV structure 300 in accordance with an embodiment of the inventive concept in contact with the lower TSV pad 150 taken along VI-VI'. Referring to FIG. 6D, the TSV structure 300 in accordance with the embodiment of the inventive concepts may include an upper TSV structure 310 contacting the upper TSV pad 250, and a lower TSV structure 320 contacting the lower TSV pad 150. The lower TSV structure 320 may include extension portions 330 which downwardly extend through the lower opening 155 to contact two side surfaces of the unit pad 151 of the lower TSV pad 150.

Figure 6E:
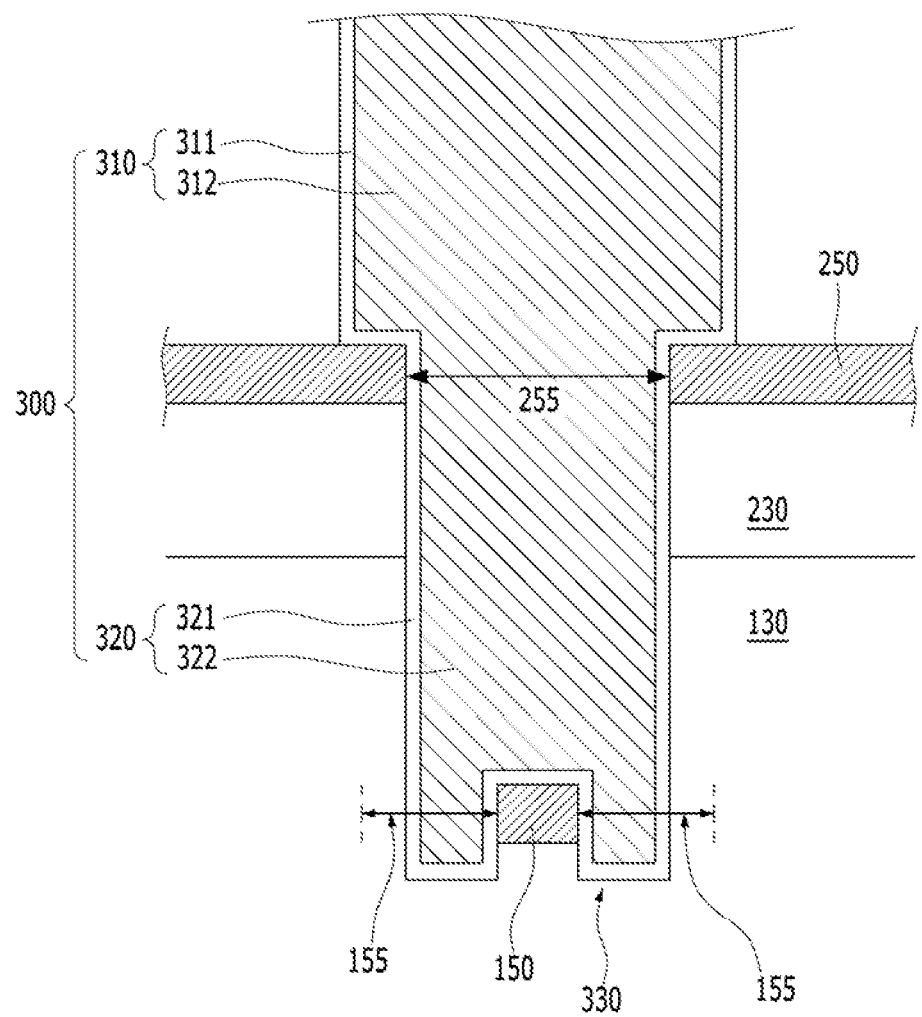
FIG. 6E is a sectional view taken along the line VII-VII' In FIG. 5D and illustrates a TSV structure which contacts a lower TSV pad in accordance with an embodiment of the inventive concept.

FIG. 6E is a schematic longitudinal sectional view illustrating the TSV structure 300 in accordance with an embodiment of the inventive concept in contact with the lower TSV pad 150 taken along VII-VII'. Referring to FIG. 6E, the TSV structure 300 in accordance with the embodiment of the inventive concepts may include an upper TSV structure 310 contacting the upper TSV pad 250 and a lower TSV structure 320 contacting the lower TSV pad 150. The lower TSV structure 320 may include extension portions 330 which downwardly extend to contact two side surfaces of the unit pad 151 of the lower TSV pad 150.

Figure 6F:
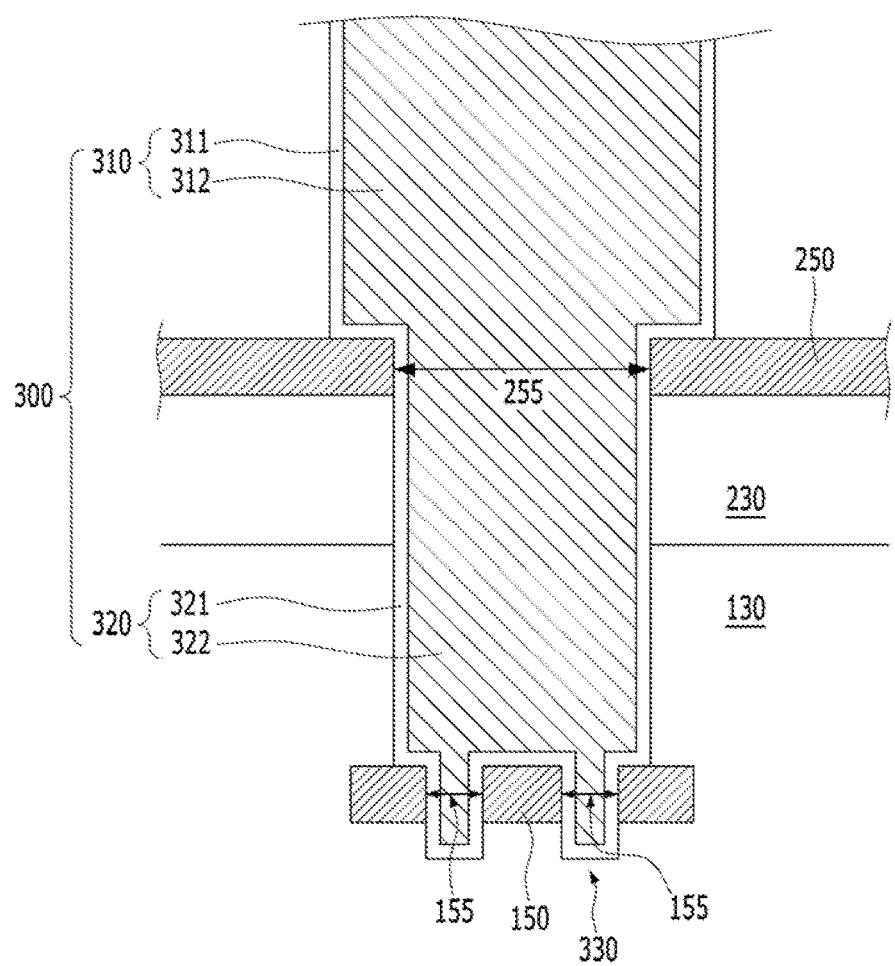
FIG. 6F is a sectional view taken along the line VIII-VIII' in FIG. 5D and illustrates a TSV structure which contacts a lower TSV pad in accordance with an embodiment of the inventive concept.

FIG. 6F is a schematic longitudinal sectional view illustrating the TSV structure 300 in accordance with an embodiment of the inventive concept shown in FIG. 5D in contact with the lower TSV pad 150 taken along VIII-VIII'. Referring to FIG. 6F, the TSV structure 300 in accordance with the embodiment of the inventive concepts may include an upper TSV structure 310 contacting the upper TSV pad 250 and a lower TSV structure 320 contacting the lower TSV pad 150. The lower TSV structure 320 may include extension portions 330 which downwardly extend to contact two side surfaces of the unit pad 151 of the lower TSV pad 150.

FIGS. 7A to 7F are schematic longitudinal sectional views illustrating a method of fabricating an Image sensor in accordance with the inventive concepts. For example, the lower TSV pad 50 shown in (A) of FIG. 5C or (B) of FIG. 5D may be described.

Figure 7A:
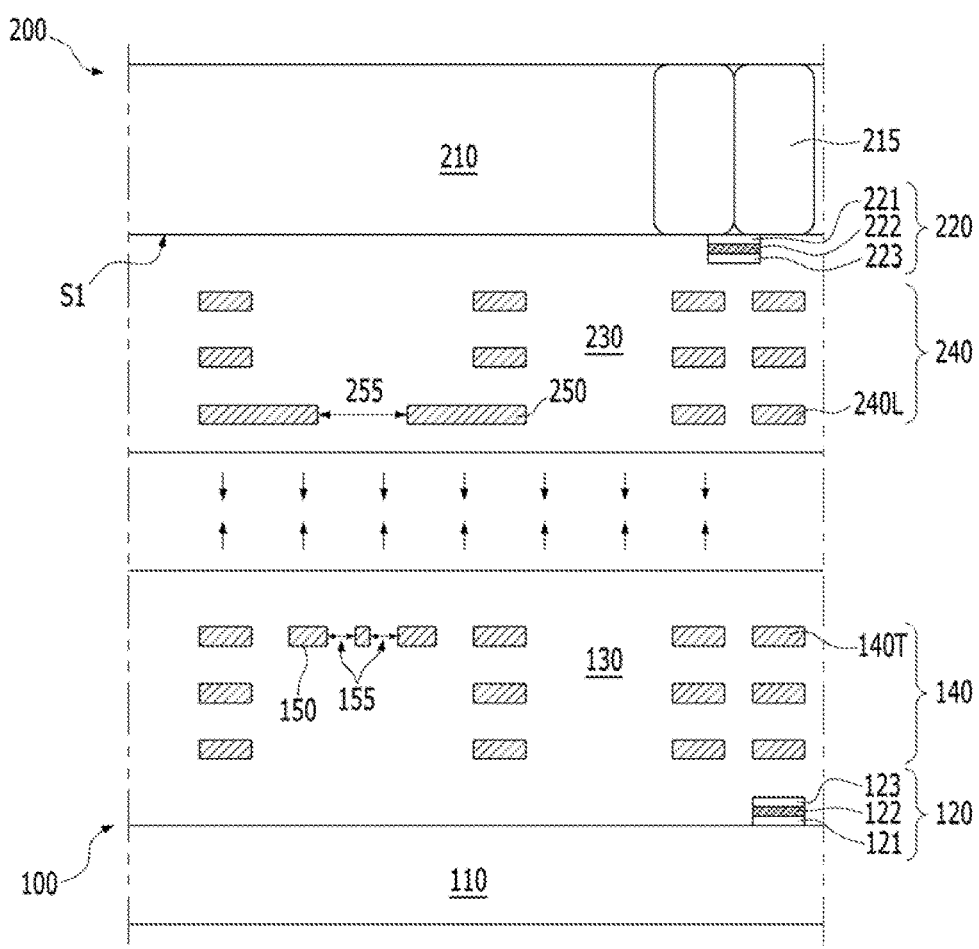
FIGS. 7A to 7F are sectional views illustrating a method of fabricating an image sensor in accordance with the inventive concepts.

Referring to FIG. 7A, a method of fabricating an image sensor in accordance with the inventive concepts may include forming a lower device 100 and an upper device 200, and bonding the lower device 100 and the upper device 200.

Forming the lower device 100 may include forming logic gates 120 on a lower substrate 110, forming multi-layered metal interconnections 140 on the logic gates 120, and forming a lower interlayer insulating layer 130 covering an upper surface of the lower substrate 110, covering or surrounding upper surfaces and side surfaces of the logic gate 120, and covering or surrounding upper surfaces, side surfaces, and/or bottom surfaces of the multi-layered lower metal interconnections 140. The lower substrate 110 may include a silicon wafer. The logic gates 120 may include logic gate insulating layer 121 which includes silicon oxide formed by performing an oxidation process or a deposition process, a logic gate electrode 122 which includes a conductor formed by performing a deposition process or a plating process, and a logic gate capping layer 123, which includes silicon oxide, silicon nitride, silicon oxy-nitride, or a combination thereof, formed by performing a deposition process. The multi-layered lower metal interconnections 140 may include a lower TSV pad 150. The multi-layered metal interconnections 140 and the lower TSV pad 150 may include copper (Cu), tungsten (W), or a combination thereof and be formed by performing a deposition process, an etch process, or plating process. The lower interlayer insulating layer 130 may include silicon oxide, silicon nitride, silicon ox-nitride, or a combination thereof and be formed by performing a deposition process or a coating process.

Forming the upper device 200 may include forming photodiodes 215 in an upper substrate 210, forming s transfer gate 220 on a first side S1 of the upper substrate 210, forming multi-layered upper metal interconnections 240 on the transfer gate 220, and forming an upper interlayer insulating layer 230 covering an upper surface of the upper substrate 210, covering or surrounding upper surfaces and side surfaces of the transfer gate 220, and covering or surrounding upper surfaces, side surfaces, and/or bottom surfaces of the multi-layered upper metal interconnections 240.

The upper substrate 210 may include one of a silicon wafer or an epitaxially grown single crystalline wafer. The photodiodes 215 may be formed in the upper substrate 210 by performing an ion implantation process for implanting n-type impurity ions such as phosphorous (P) or arsenic (As) and/or p-type impurity ions such as boron (B). The transfer gates 220 may include a transfer gate insulating layer 221 including silicon oxide and formed by performing an oxidation process or a deposition process, a transfer gate electrode 222 including a conductor and formed by performing a deposition process or a plating process, and a transfer gate capping layer 223 including at least one of silicon oxide, silicon nitride, and silicon oxy-nitride, and formed by performing a deposition process.

The multi-layered upper metal interconnections 240 may include an upper TSV pad 250. The multi-layered upper metal interconnections 240 and the upper TSV pad 250 may include at least one of metals such as copper (Cu) or tungsten (W) and be formed by performing a deposition process, an etch process, or a plating process. The upper interlayer insulating layer 230 may include at least one of silicon oxide, silicon nitride, silicon oxy-nitride, or combinations thereof and be formed by performing a deposition process or a coating process.

Bonding the lower device 100 and the upper device 200 may include pressing and bonding a surface of the lower interlayer insulating layer 130 and a surface of the upper interlayer insulating layer 230 at room temperature and at atmospheric pressure. Each of the surface of the lower interlayer insulating layer 130 and the surface of the upper interlayer insulating layer 230 may include silicon oxide.

Figure 7B:
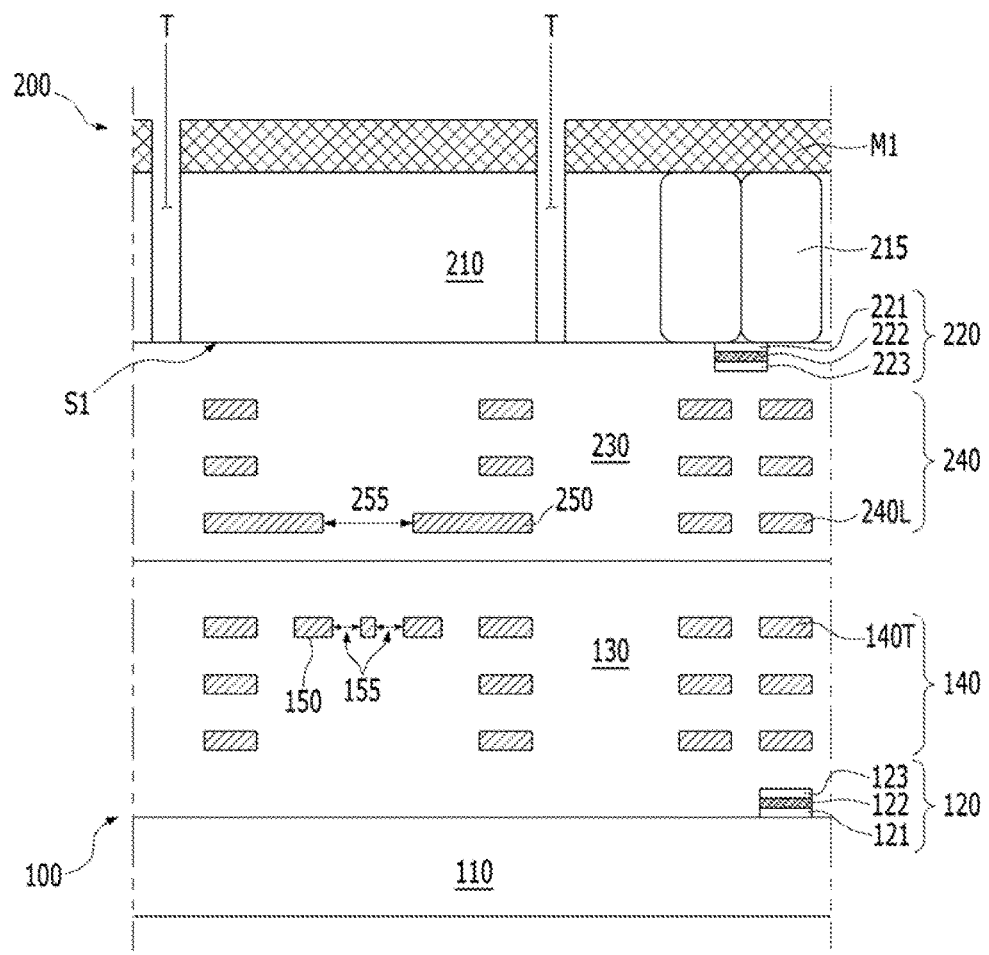

Referring to FIG. 7B, the method may include forming a first mask pattern M1 on a second surface S2 of the upper substrate 210, and forming an isolation trench T by performing an etch process using the first mask pattern M1 as an etch mask. The isolation trench T may have a rectangle shape in a top view. The isolation trench T may completely pass through the upper substrate 210. Next, the method may include removing the first mask pattern M1.

Figure 7C:
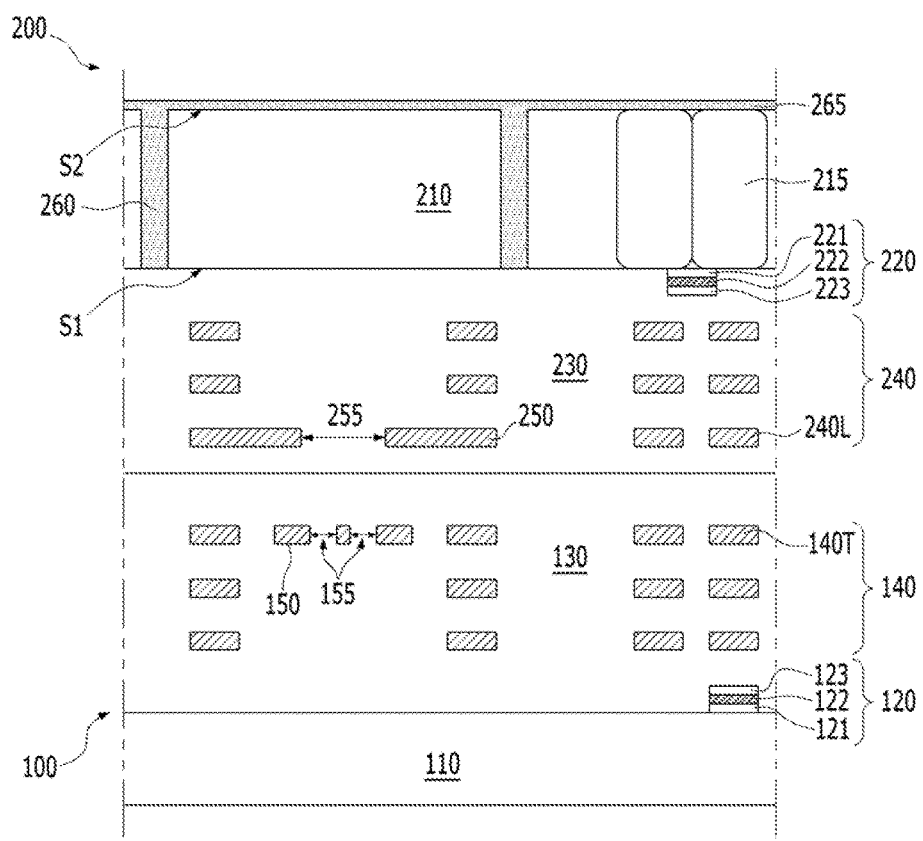

Referring to FIG. 7C, the method may include forming a TSV isolation structure 260 filling the isolation trench T using a deposition process or a gap-fill process and forming a capping layer 265 conformally formed on the second side S2 of the upper substrate 210. The capping layer 265 may include a least one of silicon oxide, silicon nitride, silicon oxy-nitride, or a combination thereof.

Figure 7D:
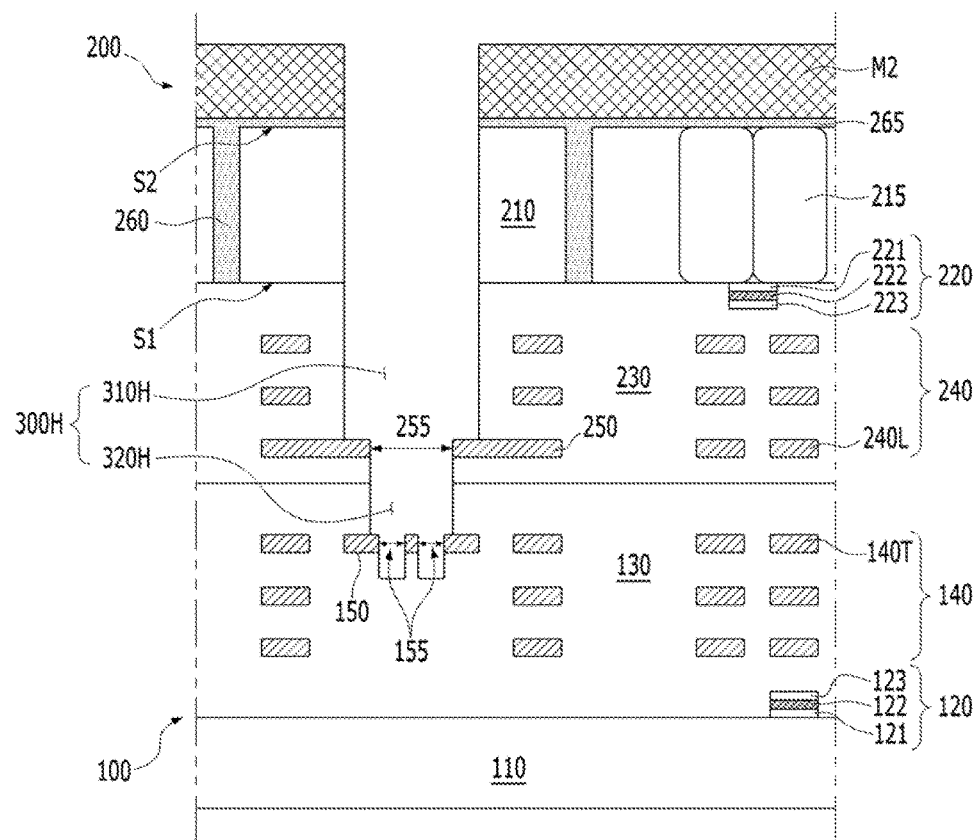

Referring to FIG. 7D, the method may include forming a second mask pattern M2 on the capping layer 265 and forming a TSV hole 300H by performing an etch process using the second mask pattern M2 as an etch mask. The TSV hole 300H may include an upper TSV hole 310H completely passing through the capping layer 265, the upper substrate 210, and the upper TSV pad 250, and a lower TSV hole 320H completely passing through the lower TSV pad 150 and partially passing through the lower interlayer insulating layer. The lower TSV hole 320H may downwardly extend below the lower TSV pad 150. A portion of the lower TSV pad 150 may be visually seen by the upper TSV opening 255. Next, the method may include a removal process to remove the second mask pattern M2.

Figure 7E:
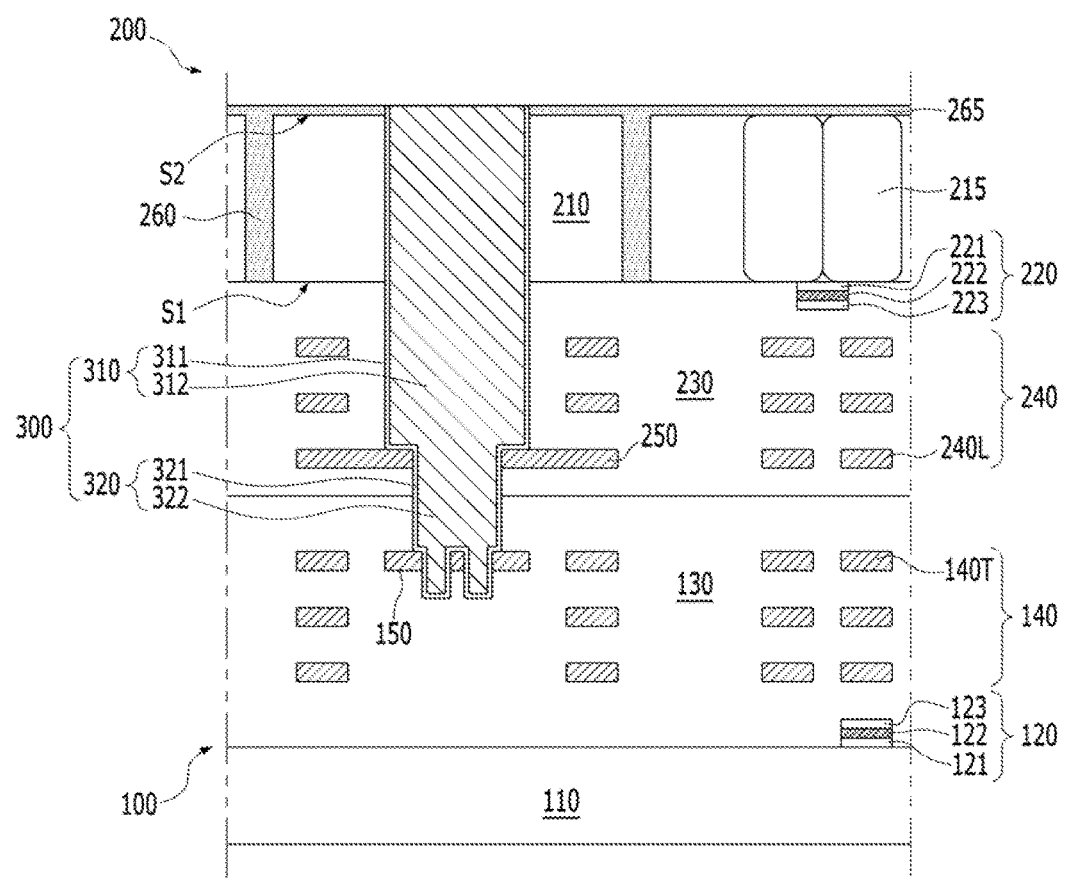

Referring to the FIG. 7E, the method may include forming TSV barrier layers 311 and 321, and TSV plugs 312 and 322 in the TSV hole 300H. The TSV barrier layers 311 and 321 may include at least one of titanium (TI), titanium nitride (TIN), tantalum (Ta), tantalum nitride (TaN), or other barrier metals, and the TSV plugs 321 and 322 may include at least one of metals such as copper (Cu) or tungsten (W) and be formed by performing a deposition process or a plating process. Next, the method may include planarizing upper surfaces of capping layer 265, the upper TSV barrier layer 311, and the upper TSV plug 312 by performing a chemical mechanical polishing (CMP) process.

Figure 7F:
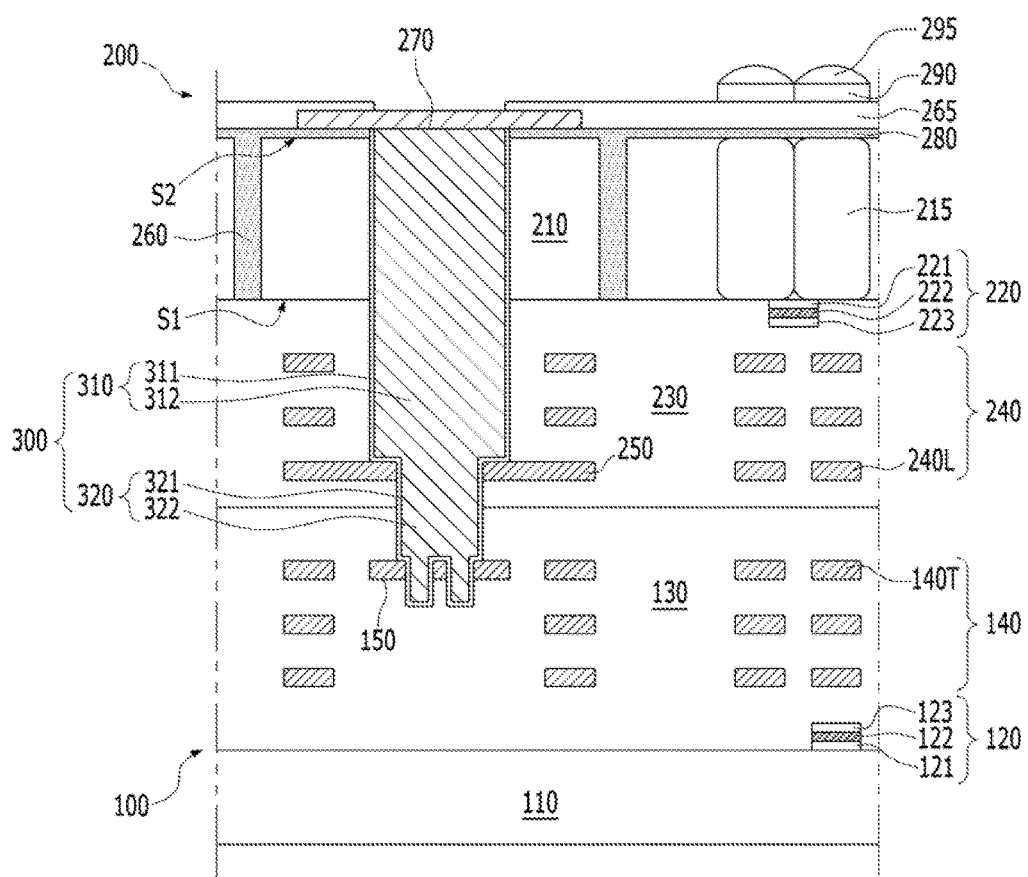

Referring to FIG. 7F, the method may include forming a passivation layer 280 on the capping layer 265, color filters 290 and micro-lenses 295 vertically aligned with the photodiodes 215 on the passivation layer 280. The method may further include performing a photolithography process and an etch process so that the passivation layer 280 exposes a portion of an upper surface of the top pad 270. The passivation layer 280 may include at least one of silicon oxide, silicon nitride, silicon oxy-nitride, or other insulating materials formed by performing a deposition process or a coating process. The color filters 290 and the micro-lenses may include one of polymeric materials.

Figure 8:
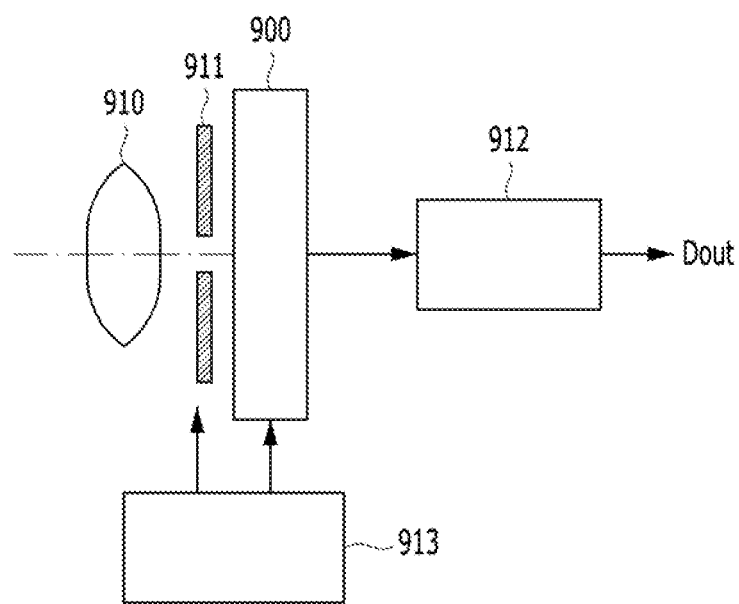
FIG. 8 is a diagram schematically illustrating an electronic device including an image sensor with a TSV structure in accordance with an embodiment of the inventive concepts.

FIG. 8 is a diagram schematically illustrating an electronic device including the image sensors including at least one of the TSV structures 300 in accordance with various embodiments of the inventive concepts.

Referring to FIG. 8, the electronic device which includes the image sensors including at least one of the TSV structures 300 in accordance with various embodiments of the inventive concepts may include a camera capable of capturing a still image or a moving image. The electronic device may include an optical system or optical lens 910, a shutter unit 911, an Image sensor 900, and a driving unit 913 and a signal processing unit 912 configured to control/drive the shutter unit 911.

The optical system 910 guides image light or incident light from a subject for photography to the pixel area 100 of the image sensor 900. The optical system 910 may include a plurality of optical lenses. The shutter unit 911 controls the light radiation and shield periods of the image sensor 900. The driving unit 913 controls the transmission operation of the image sensor 900 and the shutter operation of the shutter unit 911. The signal processing unit 912 performs a variety of types of signal processing on a signal output from the image sensor 900. An image signal Dout, which is processed, is stored in a storage medium such as memory or is displayed on a monitor.

The stacked type image sensors in accordance with various exemplary embodiments of the inventive concepts use TSV pads as an align key so that the TSV structure can be aligned exactly and the durability of the image sensors can be improved.

The stacked type image sensors in accordance with various exemplary embodiments of the inventive concepts have a TSV structure extending through a TSV pad so that electrical resistance of the TSV structure can be reduced.

The stacked type image sensors in accordance with various exemplary embodiments of the inventive concepts have an align key to form a TSV structure so that productivity and yield of the image sensors can be improved and failure rate and costs of the image sensors can be reduced. Although various embodiments have been described for illustrative purposes, it will be apparent to those skilled in the art that various changes and modifications may be made without departing from the spirit and scope of the invention as defined in the following claims.

What is claimed is:

1. An image sensor comprising:
    a lower device including a lower substrate, a lower TSV pad, and a lower interlayer insulating layer, wherein the lower TSV pad is formed over the lower substrate, wherein the lower interlayer insulating layer covers the lower TSV pad;
    an upper device including an upper substrate, an upper TSV pad, and an upper interlayer insulating layer, wherein the upper TSV pad is formed over the upper substrate, wherein the upper interlayer insulating layer covers the upper TSV pad; and
    a TSV structure vertically passing through the upper device and electrically connecting the upper TSV pad to the lower TSV pad,
    wherein the upper TSV pad includes an upper opening,
    wherein the lower TSV pad includes a unit pad and a lower opening, and
    wherein the unit pad is exposed through the upper opening and contacts the TSV structure in a top view,
    wherein the upper device further comprises:
        a photodiode formed in the upper substrate,
        a transfer gate formed over a first surface of the upper substrate,
        a multi-layered upper metal interconnection formed over the transfer gate; and
        an upper interlayer insulating layer covering the multi layered upper metal interconnection, and
    wherein the upper TSV pad is disposed at the same level as the lowermost one of the upper metal interconnection.

2. The image sensor of claim 1, wherein the unit pad has a bar shape, a crossing bar shape, a closed window shape, a frame shape, or a combination thereof.

3. The image sensor of claim 1, wherein the lower opening has a slit shape, a crossing slit shape, an open window shape, a frame shape, or a combination thereof.

4. The image sensor of claim 1, wherein virtual occupied region of the lower TSV pad is horizontally wider than the upper opening.

5. The image sensor of claim 1, wherein the TSV structure comprises:
    an upper TSV structure passing through the upper substrate and contacting an upper surface of the upper TSV pad; and
    a lower TSV structure extending from the upper TSV structure, passing through the upper TSV pad, and contacting an upper surface of the lower TSV pad.

6. The image sensor of claim 5,
    wherein the lower TSV structure comprises an extension portion, and
    wherein the extension portion passes through the lower TSV pad and extends to a level lower than the lower TSV pad.

7. The image sensor of claim 6, wherein the extension portion contacts a side surface of the lower TSV pad.

8. The image sensor of claim 1, wherein the lower device further comprises:
    a logic gate formed over a first surface of the lower substrate, a multi-layered lower metal interconnection formed over the logic gate, and
    a lower interlayer insulating layer covering the logic gate and the multi-layered lower metal interconnection, and
    wherein the lower TSV pad is disposed at the same level as the uppermost one of the lower metal interconnection.

9. The image sensor of claim 1,
    wherein the upper device further comprises a TSV isolation structure, and
    wherein the TSV isolation structure is formed in the upper substrate and between the TSV structure and the photodiode to insulate the TSV structure from the photodiode.

10. An image sensor comprising:
    a lower device including a lower TSV pad;
    an upper device including an upper TSV pad; and a TSV structure vertically passing through the upper device and electrically connecting the upper TSV pad to the lower TSV pad,
wherein the upper TSV pad comprises an upper opening,
wherein the upper opening is smaller than the lower TSV pad in size,
wherein the lower TSV pad comprises a lower opening, and
wherein the lower TSV pad is exposed through the upper opening in a top view,
wherein the TSV structure comprises:
  an upper TSV structure contacting an upper surface of the upper TSV pad;
  a lower TSV structure extending from the upper TSV structure through the upper opening to the lower TSV pad; and
  an extension portion extending from the lower TSV structure through the lower opening into the lower device.

11. The image sensor of claim 10, wherein the lower opening has a slit shape, a crossing shape, an open widow shape, or a frame shape.

12. An image sensor comprising:
a lower device comprising a lower substrate, a logic gate, a lower TSV pad, and a lower interlayer insulating layer, wherein the lower substrate, the logic gate, and the lower TSV pad are formed over the lower substrate, wherein the lower interlayer insulating layer surrounds the logic gate and the lower TSV pad;
an upper device comprising an upper substrate, a photodiode, a transfer gate, an upper TSV pad, an upper interlayer insulating layer, a capping layer, a passivation layer, a color filter, and a micro-lens, wherein the photodiode is formed in the upper substrate, wherein the transfer gate and the upper TSV pad are formed over a first surface of the upper substrate, wherein the upper interlayer insulating layer surrounds the transfer gate and the upper TSV pad, wherein the capping layer and the passivation layer are formed over a second surface of the upper substrate, wherein the color filter and the micro-lens are formed over the passivation layer; and
a TSV structure vertically passing through the upper substrate and the upper interlayer insulating layer and extending into the lower interlayer insulating layer,
wherein the TSV structure passes through the upper TSV pad and extends to the lower TSV pad.

13. The image sensor of claim 12,
wherein the upper TSV pad comprises an upper opening,
wherein the lower TSV pad comprises a lower opening, and
wherein the TSV structure comprises:
an upper TSV structure passing through the upper substrate;
a lower TSV structure extending from the upper TSV structure and passing through the upper opening; and
an extension portion extending from the lower TSV structure through the lower opening into the lower interlayer insulating layer.

14. The image sensor of claim 13, wherein the lower opening has a slit shape, a crossing slit shape, an open windows, or a frame shape.

15. The image sensor of claim 14,
wherein the lower interlayer insulating layer surrounds an upper surface and a side surface of the logic gate, and further surrounds an upper surface, a side surface, and a bottom surface of the lower TSV pad, and
wherein the TSV structure passes through the lower TSV pad and extends to the lower interlayer insulating layer and below the lower TSV pad.

* * * * *